(12) United States Patent
Okuda (10) Patent No.: US 6,248,978 B1
(45) Date of Patent: *Jun. 19, 2001

(54) HEATER COMPRISING TEMPERATURE SENSING ELEMENT POSITIONED ON ELECTRODE

(75) Inventor: Kouichi Okuda, Yokohama (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/659,625

(22) Filed: Jun. 6, 1996

Related U.S. Application Data

(63) Continuation of application No. 08/151,886, filed on Nov. 15, 1993, now abandoned.

(30) Foreign Application Priority Data

Nov. 13, 1992 (JP) ...................................................... 4-303937
Dec. 15, 1992 (JP) ...................................................... 4-353716

(51) Int. Cl.[7] .................................................... H05B 3/00
(52) U.S. Cl. ........................... 219/216; 219/469; 219/470; 219/471; 355/290

(58) Field of Search ..................................... 219/216, 469, 219/470, 471, 543, 542; 355/290; 399/328, 329

(56) References Cited

U.S. PATENT DOCUMENTS

| | | | |
|---|---|---|---|
| 4,034,189 | * 7/1977 | Sakamaki et al. | 219/216 |
| 4,350,870 | * 9/1982 | Nakayama et al. | 219/216 |
| 4,406,785 | * 9/1983 | Siefer | 210/186 |
| 4,888,463 | * 12/1989 | Middlebrook | 219/201 |
| 4,999,136 | * 3/1991 | Su et al. | 252/512 |
| 5,083,168 | * 1/1992 | Kusaka et al. | 219/216 |
| 5,149,941 | 9/1992 | Hirabayashi et al. | 219/216 |
| 5,253,024 | 10/1993 | Okuda et al. | 355/385 |
| 5,262,834 | 11/1993 | Kusaka et al. | 219/216 |
| 5,285,054 | * 2/1994 | Barsky | 219/543 |

* cited by examiner

Primary Examiner—Samuel M. Heinrich
(74) Attorney, Agent, or Firm—Fitzpatrick, Cella, Harper & Scinto (57) ABSTRACT

A heater includes a substrate having a high heat conductivity; a resistive layer on the substrate, for generating heat up on electric power supply; an output electrode on the substrate; and a temperature sensing element having an output portions placed on top of the output electrodes.

12 Claims, 9 Drawing Sheets

HEATER COMPRISING TEMPERATURE SENSING ELEMENT POSITIONED ON ELECTRODE

This application is a continuation, of application Ser. No. 08/151,886, filed Nov. 15, 1993, now abandoned.

FIELD OF THE INVENTION AND RELATED ART

The present invention relates to a heater comprising a substrate having excellent thermal conductivity, an exothermic resistive layer formed on this thermally conductive substrate, and a temperature sensing element, and also, to a fixing apparatus employing this heater.

In the past, a fixing apparatus of a heat roller type has been widely used as the image fixing thermal apparatus. This type of fixing apparatus comprises a heating roller controlled to maintain a predetermined temperature and a pressure roller having an elastic layer and being pressed on the heating roller, wherein a sheet of recording material on which an unfixed toner image has been formed is heated while it is passed between the rollers.

However, this type of fixing apparatus using the heat roller requires a large amount of electric power because of its large thermal capacity; therefore, it suffers from a long wait time. In other words, it takes a long time for the apparatus to reach a predetermined temperature after the start-up.

As a means for solving such a problem, this applicant has proposed a thermal fixing apparatus comprising a thermal heater of a small heat capacity and a piece of thin film, which has been disclosed in U.S. Pat. Nos. 5,149,941 and 444,802.

This heater comprises a resistor which generates heat as the power is supplied, and a ceramic substrate having excellent thermal conductivity, on which this resistor is formed. The power supplied to the resistor is controlled to keep constant the output of the temperature sensing element which senses the temperature of the substrate.

However, since this heater has a small heat capacity, increase in the heater temperature is fast, which amplifies the temperature ripple if the response time of the temperature sensing element is long.

Further, if the contact is poor between the temperature sensing element and the substrate, not only can a normal temperature control not be executed, but also, the temperature sometimes rises excessively.

In the fixing apparatus comprising a heater with a slow response, or a heater suffering from a poor connection, such as the above, non-uniform fixing or non-uniform glossiness occurs.

SUMMARY OF THE INVENTION

Accordingly, a principal object of the present invention is to provide a heater provided with a temperature sensing element with fast response.

Another object of the present invention is to provide a heater on which the temperature sensing element can be securely attached on the substrate.

According to an aspect of the present invention, the heater according to the present invention comprises: a substrate having excellent thermal conductivity, an exothermic resistive layer which generates heat as the power is supplied, an output electrode provided on the substrate, and a temperature sensing element, the output portions of which are placed on top of the electrodes.

These and other objects, features and advantages of the present invention will become more apparent upon a consideration of the following description of the preferred embodiments of the present invention, taken in conjunction with the accompanying drawings.

DESCRIPTION OF THE PREFERRED EMBODIMENTS

Figure 1:
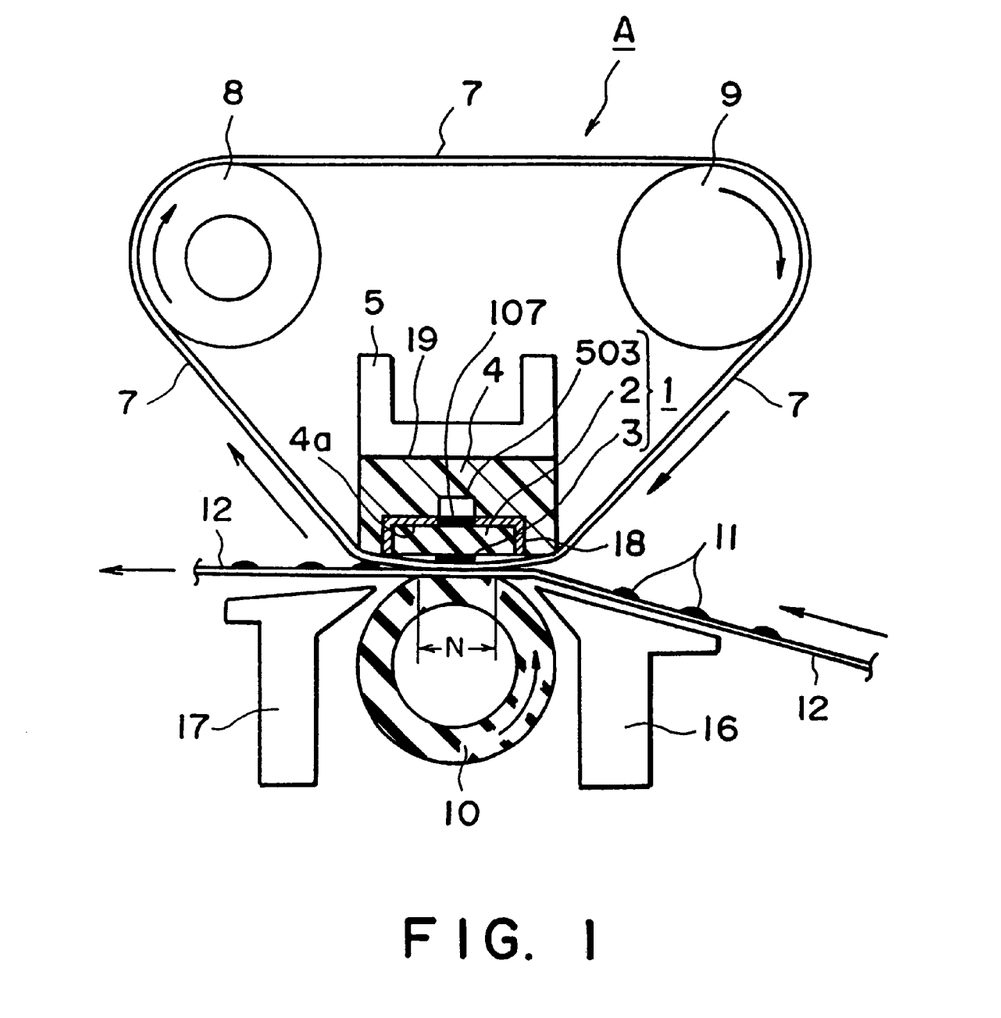
FIG. 1 is a sectional view of a preferred embodiment of the fixing apparatus in accordance with the present invention.

FIG. 1 is a sectional view of a thermal fixing apparatus employing the preferred embodiment of the heater in accordance with the present invention.

This particular heating apparatus comprises an endless fixing film 7, a driving roller 8 on the left side, a follower roller 9 on the right, a linear heater 1 with a small thermal capacity, which is fixedly supported below the substantial middle point between these two rollers, wherein the fixing film 7 is stretched around the three members 7, 8, and 1 which are arranged in parallel to each other.

As the driving roller 8 rotates in the clockwise direction, the fixing film 7 is rotated in the clockwise direction at a predetermined peripheral velocity. Since the follower roller 9 doubles as a tension roller, the endless fixing film 7 is rotatively driven without wrinkling, snaking, or delaying.

A reference numeral 10 is a pressure roller as a pressing member, comprising an elastic rubber layer such as silicone rubber with excellent parting properties. The bottom portion of the loop of the endless fixing film 7 is sandwiched between the heater 1 and the pressure roller 10, being pressed on the bottom surface of the heater 1 by the pressure roller 10 with an overall contact pressure of 4–7 kg generated by a pressure generating means, wherein the pressure roller 10 rotates in the counterclockwise direction, that is, the direction in which a sheet of recording material 12 is conveyed.

Since the endless fixing film 7 is repeatedly used to fix thermally the toner image as it is rotatively driven, monolayer or multilayer film excellent in heat resistance, parting properties, and durability, is used. Generally speaking, its overall thickness is less than 100 $\mu$m, preferably no more than 40 $\mu$m. For example, a piece of monolayer film of heat resistant resin such as polyimide (PI), polyetherimide (PEI), PIS, or PFA (copolymer of tetrafluoroethylene and perfluoroalkyl vinyl ether), is used, as well as multilayer film in which, for example, a piece of 20 $\mu$m thick film is coated at least on the surface which comes in contact with the image, with a 10 $\mu$m thick parting layer of fluorinated resin such as PTFE (tetrafluoroethylene), PAF or the like, containing electrically conductive material.

The heater 1 is a linear heater of a small heat capacity, the longitudinal direction of which is perpendicular to the direction in which the film is moved, and comprises a heater substrate 2 with excellent thermal conductivity, an exothermal resistive layer 3, a thermistor 503 which serves as the temperature detecting element, and the like.

The substrate 2 is made of a material which is electrically insulating, highly heat resistant, and of a low thermal capacity. For example, it is made of an alumina substrate measuring 1.0 mm thick, 10 mm wide, and 240 mm long.

The exothermic layer 3 is a linear, or a belt of, low thermal capacity layer formed on the substrate 2, on the surface on which the film slides, at the substantial cross-sectional center, along the longitudinal direction of the substrate 2, by coating 1.0 mm wide (screen-printing or the like) electrically resistive material such as $Ta_2N$, silver/palladium, ruthenium oxide, or the like.

The heater 1 is fitted in a heating member accommodating groove 4a cut in a thermally insulating heater holder 4, on one of the surfaces, along the longitudinal direction of the heater holder, which is also perpendicular to the direction in which the recording material is moved, and is glued there with an adhesive 18, being fixedly held by the holder 4 and exposing the surface on which the exothermic layer 3 is present. Then, this holder 4 is fixedly supported by being glued with an adhesive 19 to the bottom surface of a supporting member 5 as a stationary member of the fixing apparatus, with the heater 1 facing downward.

The heater holder 4 is made of highly heat resistant resin such as PPS (polyphenyl sulfide), PAI (polyamide imide), PI (polyimide), PEEK (polyether ethyl ketone), liquid polymer, or the like, or composite material composed of these resin and ceramics, metal, glass or the like.

An AC voltage is applied from the longitudinal opposite ends of a linear, or a belt of, exothermic layer 3, whereby heat is generated across the entire length of the exothermic layer 3.

The temperature of the heater 1 is detected by the temperature sensing element 503, and a microcomputer controls the power supplied to the exothermic layer 3 so that the thus detected output is maintained at a predetermined level.

Further, in this embodiment, a sensor (not illustrated) for detecting the leading/trailing ends of the sheet is positioned adjacent to the fixing apparatus A, on the upstream side of the fixing apparatus A, with reference to the direction in which the transfer material sheet is conveyed, and the sheet detection signal from this sensor is used to execute a control so that the power is supplied to the exothermic layer 3 only during the necessary period, that is, while a sheet 12 is passing through the fixing apparatus A.

As an image formation start signal is given, an unshown image forming mechanism begins to carry out an image forming operation, and the transfer material sheet 12 carrying on the upper surface an unfixed toner image 11 is conveyed toward the fixing apparatus A. As soon as the leading end of the transfer material sheet 12 is detected by the above-mentioned sensor (not shown) positioned adjacent to the fixing apparatus, the rotation of the fixing film 7 is started, whereby the transfer material sheet 12 is guided by a guide 16 into a compression nip N (fixing nip) formed between the heater 1 and pressure roller 10, between the fixing film 7 and pressure roller 10, with the surface carrying the unfixed image being tightly pressed upon the bottom surface of the fixing film 7, which are moving together, as if being laminated with the moving fixing film 7, and is passed through the fixing nip N, without slipping or wrinkling, while being subjected to the compressing force of the fixing nip N between the heater 1 and pressure roller 10.

While the sheet 12 is passed through the fixing nip N, with its toner image carrying surface being tightly pressed on the fixing film surface, it is subjected through the fixing film 7 to the heat generated by the exothermic layer 3 of the heater 1, whereby the toner image 11 is fused by the high temperature onto the surface of the sheet 12.

In the apparatus of this embodiment, the sheet 12 as the recording material and the fixing film 7 are separated as the sheet 12 comes out of the fixing nip N.

The toner temperature at this separating point is higher than the glass-transition point ring and ball method.

While the sheet 12 separated from the fixing film 7 is guided by a guide 17 to a discharge roller, the toner temperature, which is higher than the glass-transition point, naturally drops (natural cooling) below the glass-transition point, solidifying the toner. Then, the sheet 12 with fixed image is discharged.

In the heater of this embodiment, the surface of the substrate on which the exothermic layer 3 is formed is the surface on which the film 7 slides; therefore, this substrate surface comprising the exothermic layer 3 is preferred to be protected by being coated with a protective layer of sliding wear resistant material such as $Ta_2O_5$ or the like.

Figure 2:
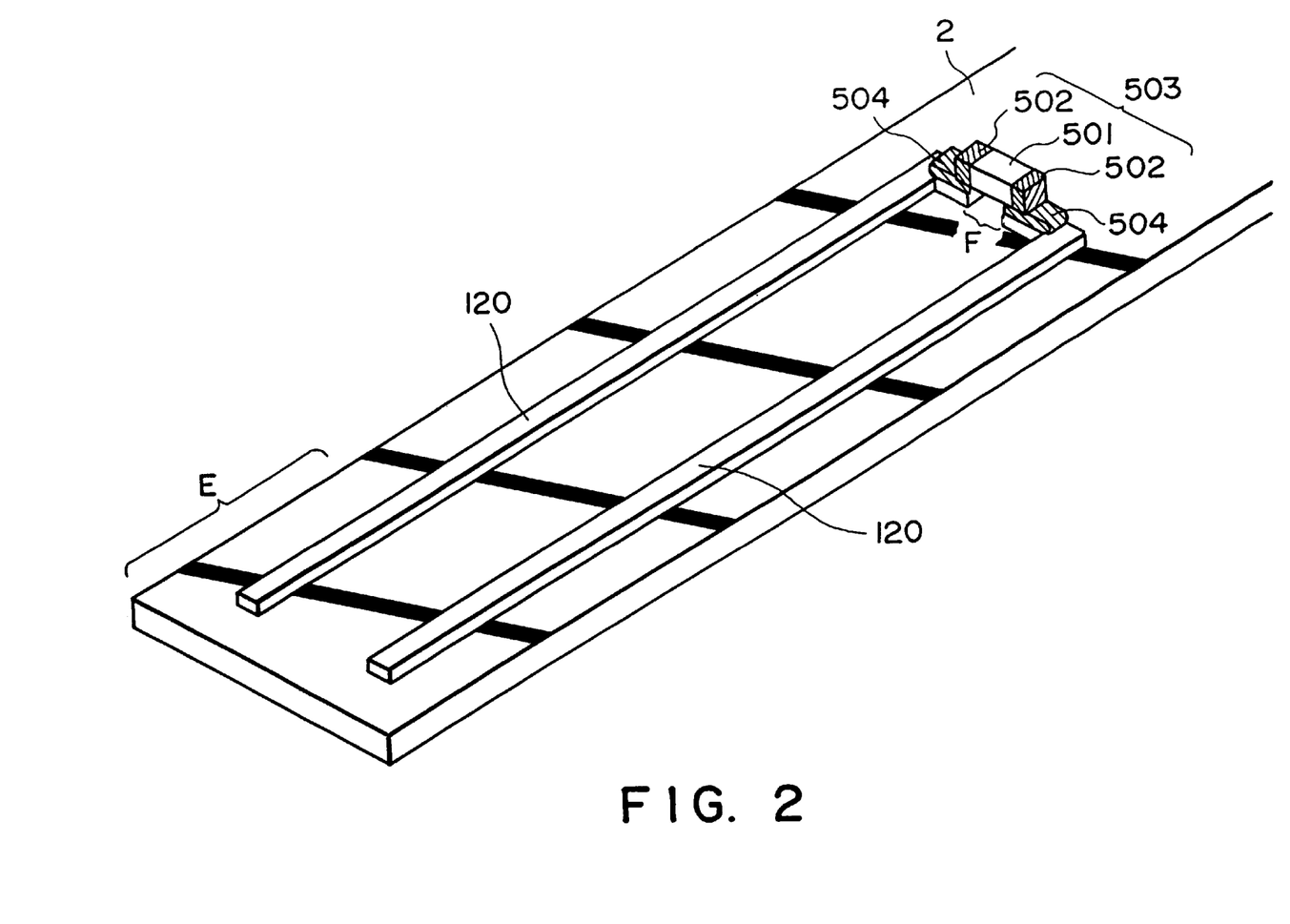
FIG. 2 is an enlarged view of a portion of the heater in the embodiment of the present invention.

FIG. 2 is an enlarged view of the back surface of the heater substrate with excellent thermal conductivity, showing how and where the thermistor is positioned.

A pair of electrodes 120 are provided on the substrate 2 composed of the highly heat conductive ceramic material such as alumina, AlN, or the like, on the surface opposite to the one on which the exothermic resistive layer 3 is present. The electrodes 120 are made of metal such as Ag, Ag/Pd, Ag/Pt, Pt, Au, or the like, and is approximately 10 $\mu$m thick. On these electrodes 120, a thermistor chip 503, which is the temperature sensing element, is soldered with a solder 504 such as Sn/Pb eutectic solder or the like, the melting point of which is higher than 300° C.

The thermistor chip 503 comprises a block 501 and a pair of electrodes 502, and has a negative temperature coefficient. The block 501 is cut out to a size of 1.6 mm×0.8 mm×1.0 mm from solid solution, or baked mixture, of a metallic oxide such as $Fe_3O_4$, $MgCr_2O_4$, $MgAl_2O_4$, NiO, $Mn_2O_3$, $CO_2O_3$, or the like. The electrodes 502 are made of Ni or the like and are placed in a manner to embrace the opposite ends of the block 501.

The electrodes through which the output of the thermistor chip 503 is picked up are positioned on the thermally conductive ceramic substrate as described above, and the thermistor 503 is soldered to the electrodes, with its output portion being placed on top of the electrodes.

Thus, the thermistor chip is firmly soldered to the heater substrate. Further, since the solder has high heat conductivity, there is hardly any thermal contact between the heater and thermistor, enhancing the responsiveness of the thermistor.

Further, in this embodiment, if the electrically conductive material such as the solder sticks out into a space F between the electrodes, the temperature sensing portion of the thermistor 503 is shortened, whereby the temperature/resistivity properties may change. In order to prevent this problem, it is preferred that a thin film of electrically insulating material such as glass be formed on the exposed surface of the temperature sensing block 501.

The output of the thermistor is picked up by connecting an unshown connector to an end portion E of the heater.

Figure 3A:
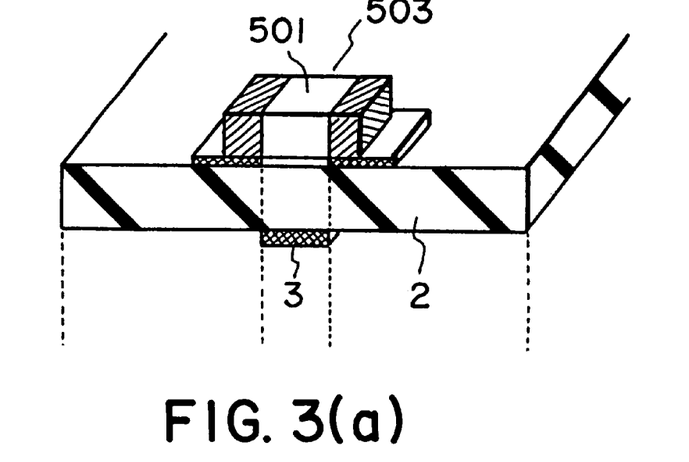
FIG. 3(a) is a sectional, oblique view of the portion of the heater.
Figure 3B:
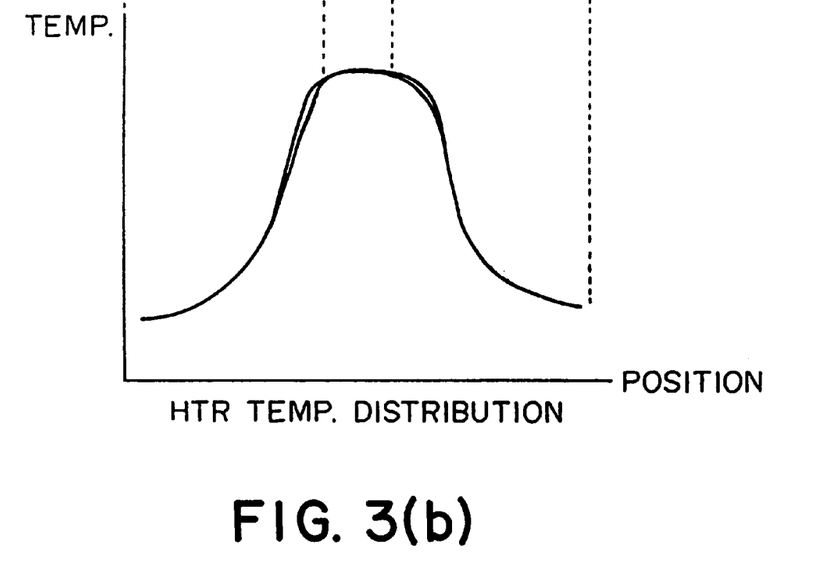
FIG. 3(b) is a graph showing the temperature distribution of the heater.

FIG. 3 shows the positional relation between the thermistor and heat generating layer, and the temperature distribution.

In this embodiment, as depicted in FIGS. 3(*a*) and 3(*b*), the thermistor 503 is positioned in a manner to correspond to the peak of the temperature distribution in the cross-sectional direction of the heater, that is, at a location straight above the heat generating layer 3, on the surface opposite to the one where the heat generating layer is.

Therefore, the responsiveness of the thermistor is excellent.

Further, as for the adhesive for attaching the thermistor, if electrically conductive adhesive made by mixing heat resistant resin, such as epoxy, polyimide, silicon, or the like, with particles of electrically conductive material such as Ag, Au, Ag/Pd, Ag/Pt, Pt, Cu, Ni, or carbon; electrically conductive glass paste made by mixing glass paste with the preceding electrically conductive particles; or various metallic solder made of such combination as Au-Cu, Au-Sn, Au-Ge, Au-Ga, Au-Sb, Au-In, Ag-Cu-Zn, Pd-Ag-Cu, or Pd-Ag-Mn, is employed instead of the ordinary solder, the adhesion becomes more impervious to heat cycle.

For example, in the case of the ordinary solder, cracks appeared in the soldered portion after 10,000 heating cycles in a heat cycle test using a temperature range of between 25° C. and 200° C. However, when the electrically conductive heat resistant resin or electrically conductive glass paste such as those described in the foregoing were used, no cracks appeared in the adhered portion even after more than 100,000 heating cycles, and the strength with which the thermistor was adhered did not change. In addition, the above-mentioned electrically conductive heat resistant resin and electrically conductive glass paste were excellent in thermal conductivity.

The electrically conductive glass paste is a mixture of: particles, the size of which is less than 325 mesh-pass (American scale) (less than approximately 43 $\mu$m), of metallic material such as Ag, Au, Pt, Cu, Ni, $RuO_2$, W, or Mo, or electrically conductive micro-particles of metallic oxide; powder of inorganic binder made by mixing additives such as $Bi_2O_3$, PbO, ZnO, CaO, or CuO into glass of boron silicate, aluminum silicate, or the like, which enables the glass paste to adhere to the ceramic substrate; organic binder such as ethyl cellulose for giving pasty fluidity; and solvent such as TERPINEOL or butyl carbitol having a high boiling point, and is generally called "thick film paste."

When this electrically conductive glass paste is baked, the solvent and organic binder are burned away normally at approximately 400° C., and as the temperature exceeds 600° C., the inorganic binder melts to serve as the adhesive.

During this baking period, the temperature is extremely high; therefore, the temperature/resistivity properties of the thermistor sometimes changes. Generally speaking, in the case of the metallic solders, temperatures higher than 600° C. are needed to melt it. There are metallic solders such as Au-Sn or Au-Ga having a melting point lower than 600° C. However, these solders display high reactivity; therefore, they cannot be baked unless they are placed in an inert gas.

On the other hand, in the case of the electrically conductive heat resistant resin, the resin can harden at a room temperature if it is of the RTV silicone group; epoxy resin can be hardened at a temperature no higher than 250° C.; and polyimide resin can be hardened at a temperature no higher than 350° C. Therefore, the temperature/resistivity properties do not change at a baking temperature such as the above.

Further, as for the silicone resin which can be cured in the normal ambience, it is made by mixing the electrically conductive power into the RTV silicone, and when it is exposed to the air, it reacts with the moisture in the air to condense and harden.

As for the epoxy resin, it is made by mixing prepolymer with a hardening agent, which does not react at the normal temperature, but reacts at a high temperature, and the electrically conductive powder. It is thermally hardened after the application.

As for the polyimide resin, it is made by dissolving prepolymer in a solvent such as N-methyl pyrolidone, and adding the electrically conductive powder into this solution. After the application, the solvent is dried at a temperature of approximately 150° C., and then, is made to react to harden at a high temperature of approximately 350° C.

As was stated in the foregoing, the electrically conductive resin adhesives are preferred as the adhesive for attaching the thermistor.

Figure 4:
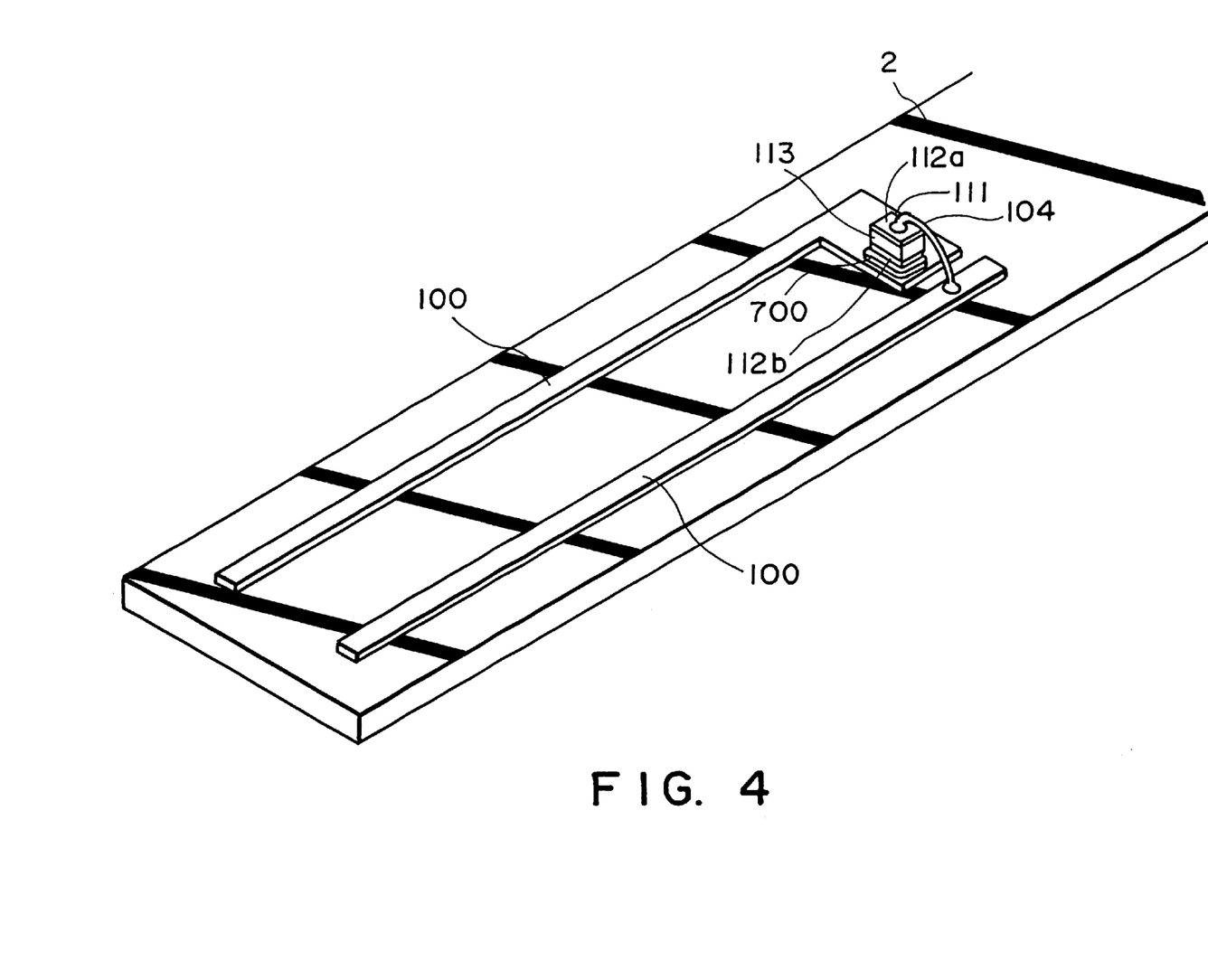
FIG. 4 is an enlarged view of a portion of an alternative embodiment of the heater in accordance with the present invention.

FIG. 4 is an enlarged view of a portion of the heater in an alternative embodiment of the present invention.

A thermistor chip 111 comprises a block 113 and a pair of electrodes 112*a* and 112*b* which are placed at the opposite ends of the block 113. The block 113 is cut out, to a size of 1 mm square, from a solid solution of a metallic oxide such as $Fe_3O_4$, $MgCr_2O_4$, $MgAl_2O_4$, NiO, $Mn_2O_3$, $CO_2O_3$, or the like, or the baked mixture of the preceding metallic oxides.

First, an electrode 112*b* of the thermistor chip 111 is attached to one of a pair of electrodes 100, with the above-mentioned solder, electrically conductive heat resistant resin, or electrically conductive glass paste, and then, an electrode 112*a* of the thermistor chip 111 is connected to the other of the pair of electrodes 100, with a wire 104. The thermistor 111, wire 104, and electrodes 100 are partially coated with the aforementioned resin or glass, preventing the wire from being disconnected.

The thermistor 111 is positioned on the side opposite to the one on which the exothermic layer is present, in a manner to oppose the exothermic layer, interposing the substrate 2.

As was described in the foregoing, the large piece of solid material such as the metallic oxide is cut into small pieces to be used as the thermistor. Generally speaking, when the material is cut into uniform pieces of a predetermined size, the temperature/resistivity properties become different for each lot of material. In order to prevent this problem, the size of the piece is varied each time the different lot of the solid material is cut, so that the temperature/resistivity properties become the same. In the case of the structure as shown in FIG. 2, the size of the thermistor needs to be at least as large enough to span between the pair of electrodes 120, whereby the size is restricted. However, in the case of the structure of the embodiment shown in FIG. 4, there is no such restriction, allowing the size of the thermistor to be freely selected; therefore, variance in the temperature/resistivity properties of the thermistor can be reduced.

Figure 5:
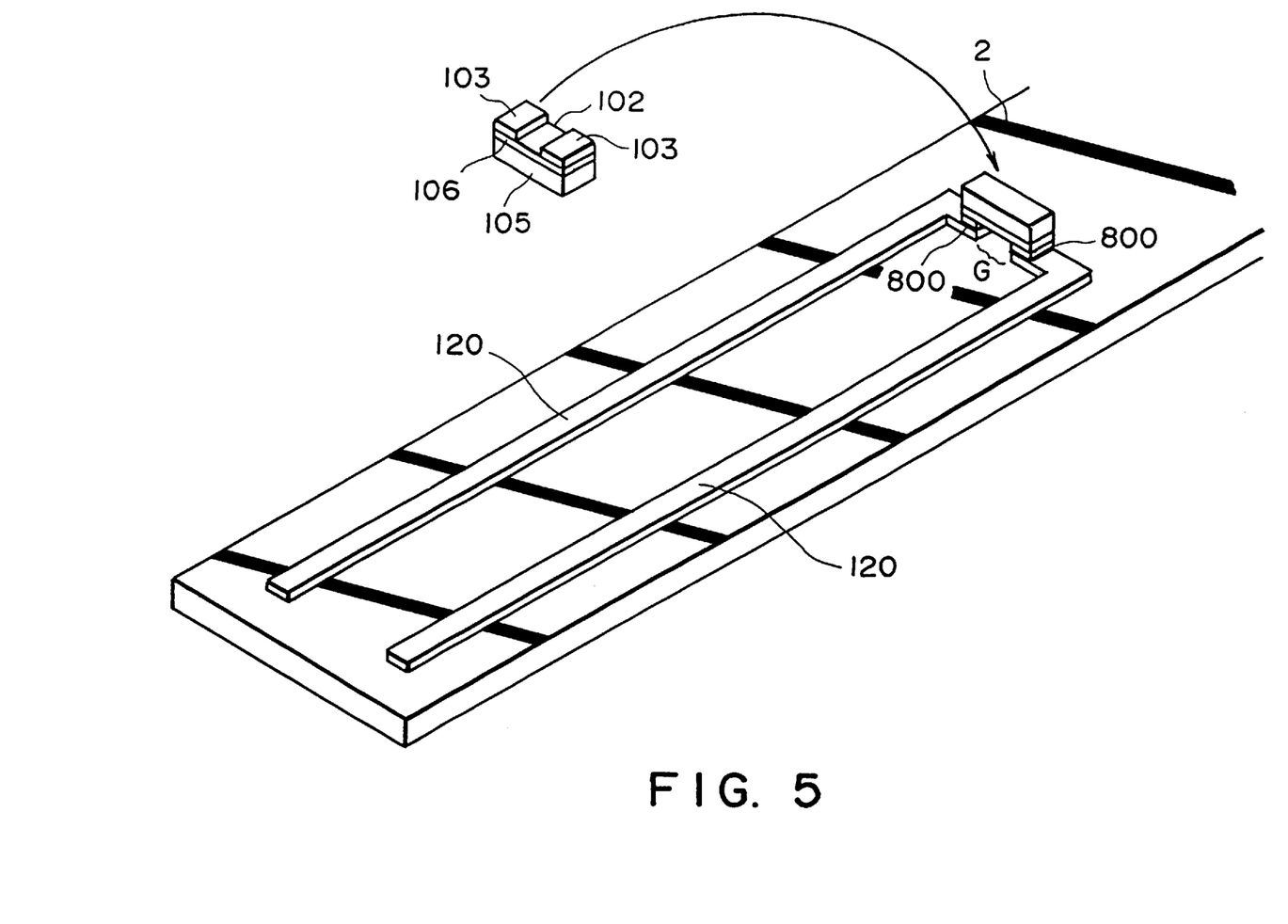
FIG. 5 is an enlarged view of a portion of another alternative embodiment of the present invention.

FIG. 5 is a sectional view of a portion of the heater in another alternative embodiment of the present invention.

This thermistor chip 102 is positioned in a manner so as to face its temperature sensing film 106 toward the heater substrate 2. The pair of electrodes 103 and the pair of electrodes 120 are soldered, or are glued with the electrically conductive heat resistant resin or electrically conductive glass, in such a manner so as to oppose to each other with a space between them. The thickness of this solder or adhesive layer 800 is preferred to be less than 50 $\mu$m. This is because if the solder or adhesive layer 800 is thick, the difference in thermal expansion, which occurs between the heater substrate 2 and the solder or adhesive layer 800, or between the thermistor substrate 105 and the solder or adhesive layer 800, separates the thermistor from the heater substrate 2.

This problem can be solved by making the solder or adhesive layer 800 thin, since a thin layer of the solder or adhesive layer expands or contracts together with the heater substrate or thermistor substrate, preventing the development of stress. When the solder is used, paste of solder is printed by screen-printing to a thickness of approximately 30 $\mu$m on the electrodes 120, and then, the thermistor 102 is placed on top of the printed paste of solder. Next, heat is applied to melt the solder, completing the soldering process.

When the electrically conductive resin or electrically conductive glass is employed as the adhesive, it may be screen-printed on the electrodes 120 in the same manner as the solder, to be baked by heat after the thermistor 102 is placed on top of it, or a proper amount of it may be coated on the electrodes 120 by a dispenser, to be baked by heat after the thermistor is placed on the adhesive and is pressed down with a predetermined pressure.

Further, it is preferable for film of electrically insulating material such as glass to be formed on the exposed surface of the temperature sensing film 106 of the thermistor, so that the temperature/resistivity properties of the thermistor 102 is prevented from being changed by the solder or adhesive layer 800 sticking out into a space G between the electrodes 102.

In this embodiment, if the heater substrate 2 and thermistor substrate 105 are formed of the same material, their coefficients of thermal expansion can be the same, which prevents the thermistor separation.

Further, since the temperature sensing film 106 of the thermistor faces toward the heater, the thermistor can respond quicker.

When the thermistor, that is, the temperature sensing element, is positioned on the electrodes through which the output is picked up, the distance between the electrodes is small. This short distance between the electrodes creates the following problem.

The electrode through which the output of the temperature sensing element is picked up is generally made of Ag. Under a high temperature condition, Ag is ionized by the moisture in the air, causing a phenomenon called "migration," in which the electrodes are shorted by the ionized Ag which is caused to migrate by the electric field generated between the electrodes. The problem involving this phenomenon occurs less frequently if material such as Au, Ag/Pd, Ag/Pt, or the like is employed as the electrode material, but such material is rather expensive compared to Ag.

The migration also can be prevented by coating the electrodes and temperature sensing element with moistureproof material such as silicone resin, epoxy resin, or glass. However, when this method was applied, the temperature sensing element was separated by the thermal expansion/contraction of the moistureproof coating which was caused by being subjected to repetition of the heating/cooling cycle of the heater. If the moistureproof material is coated only on the electrodes, without coating the temperature sensing element, the separation of the temperature sensing element does not occur, but this method cannot prevent the migration.

Hereinafter, a preferred embodiment will be described, in which the migration can be prevented in spite of the employment of the Ag electrodes.

Figures 6, 7:
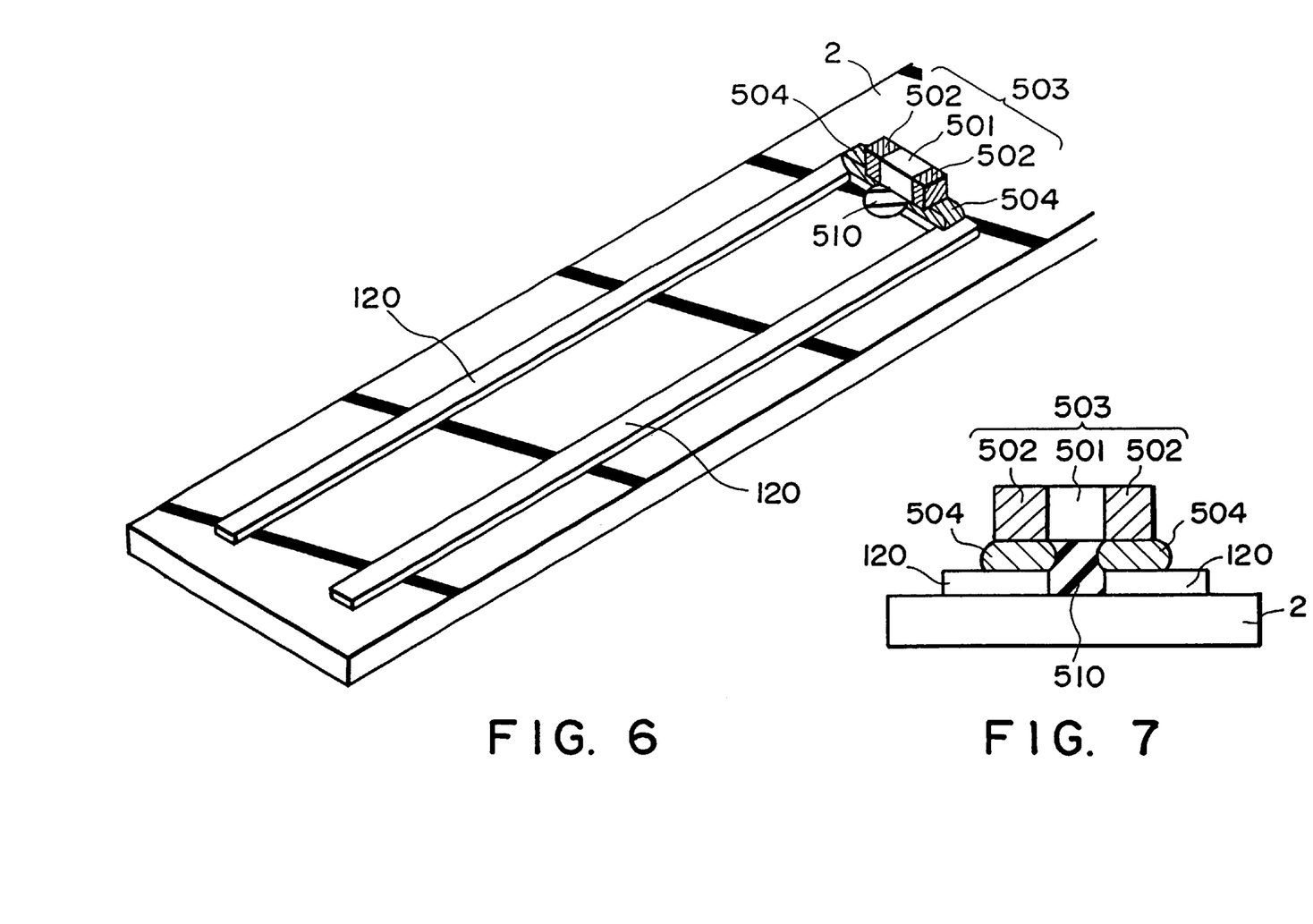
FIG. 6 is an enlarged view of a portion of a further embodiment of the present invention.
FIG. 7 is a sectional view of the embodiment shown in FIG. 6.

FIG. 6 is an oblique view of the heater in another alternative embodiment of the present invention, and FIG. 7 is a sectional view thereof.

A pair of electrodes 120 made of Ag are attached to the substrate 2 made of highly heat conductive ceramic such as alumina or AlN, on the surface opposite to the side on which an exothermic layer 3 is attached. On the electrodes 120, a thermistor 503 is glued with an electrically conductive adhesive 504. The electrically conductive adhesive 504 is an epoxy resin, polyimide resin, glass, or the like, in which Ag particles are dispersed.

The pair of electrodes 120 are arranged to oppose to each other, holding a predetermined gap. This gap and a space surrounded by a heat sensitive portion 501 of the thermistor chip and the substrate 2 are filled with an electrically insulating material 510 such as epoxy resin, silicone resin, polyimide resin, fluorinated resin, glass, or the like, to prevent the Ag ions from moving between the electrodes 120, in other words, to prevent the migration.

Further, the presence of this electrically insulating material 510 improves the thermal conduction from the substrate 2 to the thermistor 503, improving thereby the responsiveness of the thermistor 503. Also, when material having adhesive properties is used as the electrically insulating material 510, adhesion between the thermistor 510 and substrate 2 is improved, whereby the thermistor is made less liable to drop off while the heater is handled.

A heater such as the one described above was used under a condition in which the distance between the electrodes was 1.0 mm; voltage applied to the thermistor was 5 V; temperature was 80° C.; and relative humidity was 95%, wherein the time it takes for the short-circuit to be caused by the migration was measured. The results are shown in Table 1.

TABLE 1

| Insulative Material | Time up to Short-Circuit |
|---|---|
| Yes | >2000 hrs. |
| No | ≦1000 hrs. |

As can be learned from Table 1, without the presence of the insulating material, the short-circuit occurred within 1,000 hours, but with the presence of the insulating material, it did not occur even after 2,000 hours.

Further, when the moistureproof material such as epoxy resin, polyimide resin, silicone resin, or fluorinate resin is coated on both the electrodes 120 of the heater and the thermistor 503, the adhesion of the thermistor to the substrate is improved by the presence of the electrically insulating material 510; therefore, the thermistor 503 does not separate from the substrate in spite of the repetition of the heating/cooling cycles.

In this embodiment, the moistureproof material was coated after the thermistor 503 was attached through the process in which the adhesive 504 was coated on the electrodes; the thermistor was placed on the coated adhesive 504 and was pressed thereon; the insulating material 510 was filled; and the adhesive and the filler were hardened. However, the moistureproof coat and the insulating material 510 may be formed at the same time. In this case, first, the adhesive 504 is coated on the electrodes 120; the thermistor 503 is placed on the adhesive and pressed thereon; and then, the adhesive is hardened. Next, fluid material with a low viscosity, which is produced, for example, by dissolving the insulating material into solvent, is coated or dripped adjacent to the thermistor 503, so that the insulating material solution is attracted by capillary force into the gap between the thermistor 503 and substrate 2, where it forms the moistureproof coat and insulating material 510 at the same time.

Further, in this embodiment, Ag was used as the electrode material, but also, other material such as Au, Ag/Pt, or Ag/Pd can be effectively used.

Figures 8, 9:
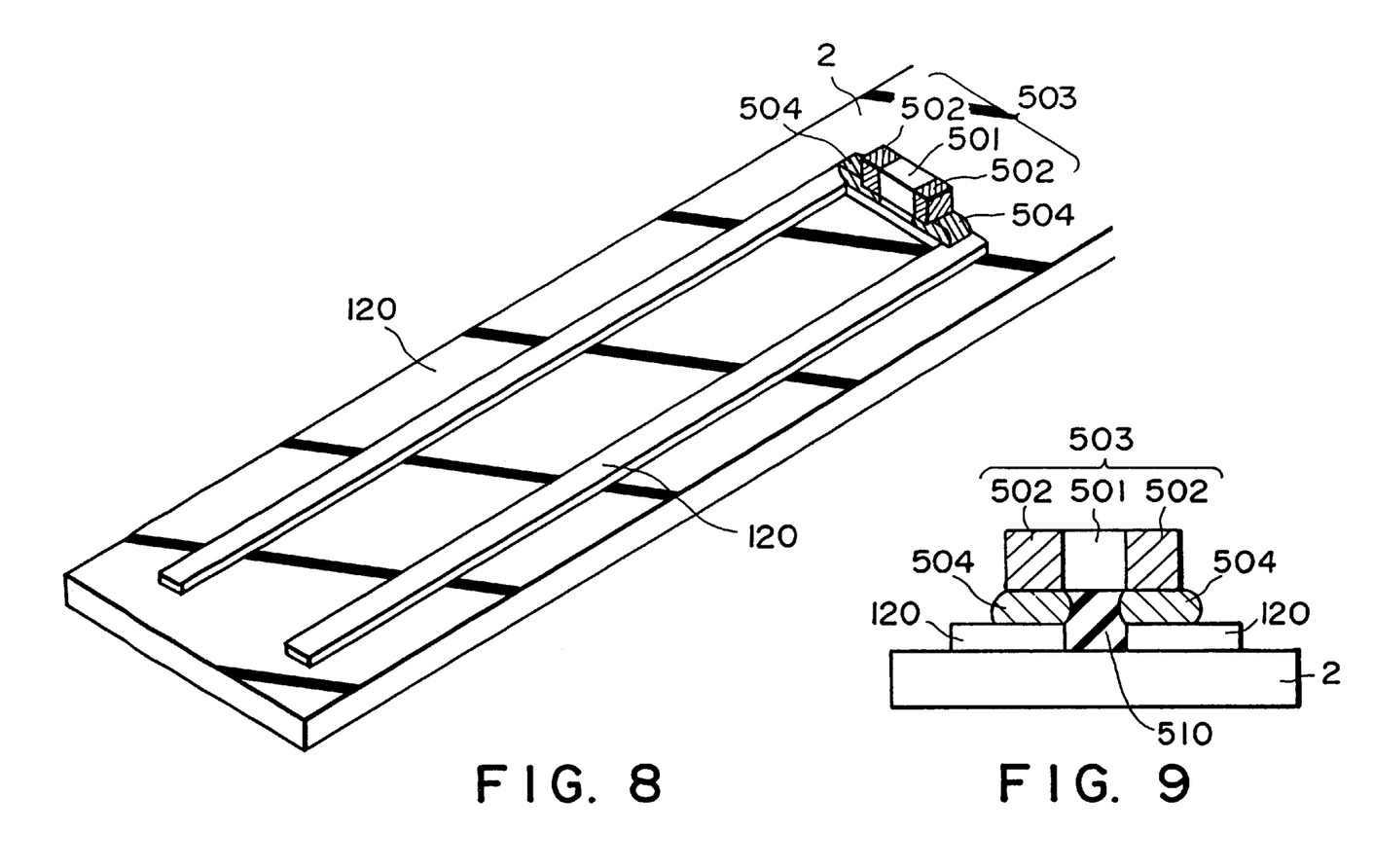
FIG. 8 is an enlarged view of a portion of yet another alternative embodiment of the present invention.
FIG. 9 is a sectional view of the embodiment shown in FIG. 8.
Figure 10:
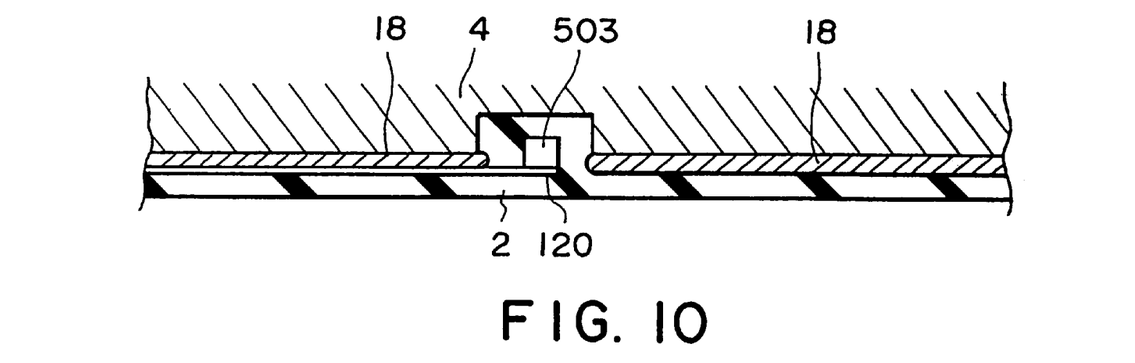
FIG. 10 is a sectional view depicting how the heater shown in FIGS. 8 and 9 is glued on a holder.

FIGS. 8 to 10 depicts additional alternative embodiments of the present invention.

FIG. 8 is an enlarged view of a portion of the heater, where the thermistor is positioned on the back surface of the substrate in the embodiment of the present invention, and FIG. 9 is a sectional view thereof. As shown in FIGS. 8 and 9, a pair of electrodes 120 made of Ag are provided on the substrate 2 made of highly heat conductive ceramic material such as alumina or AlN, on the surface opposite to the side on which an exothermic layer 3 is present. On the electrodes 120, a thermistor 503 is glued with an electrically conductive adhesive 504. The electrically conductive adhesive 504 is epoxy resin, silicone resin, polyimide resin or the like, in which Ag particles are dispersed.

Figure 11:
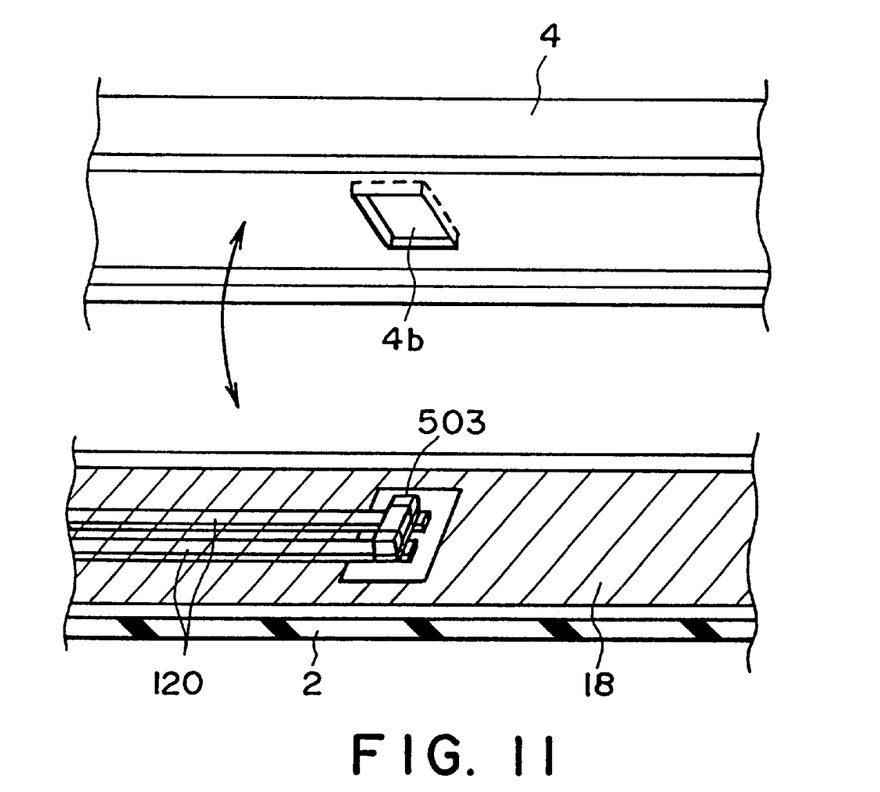
FIG. 11 is a drawing for depicting the recessed portion shown in FIG. 10.

In FIG. 10, how the substrate 2 of the heater 1 is glued to a heater holder 4 is shown. The heater holder 4 is provided with a hole 4b as shown in FIG. 11, so that the thermistor 503 does not come in contact with the heater holder 4. With the two components being adhered in such a manner as shown in FIG. 10, this hole 4b is sealed with an adhesive 18, whereby the thermistor 503 located within the boundary of this hole 4b and a pair of electrodes 120, as well as the adhesive joint between the thermistor 503 and electrodes 120, are prevented from being exposed to the air.

Since permeation of moisture is prevented by sealing hermetically the output circuit system for the thermistor, the migration can be prevented.

Further, the adhesive 18 may be replaced by an elastic material which does not have adhesiveness. This is because the heater 1 is constantly pressured upward from underneath by the pressure roller 10, which can keep the output circuit system of the thermistor hermetically sealed.

Further, gas such as N2, which tolerates only a small amount of moisture, may be sealed in the hole 4b of the holder.

Figure 12:
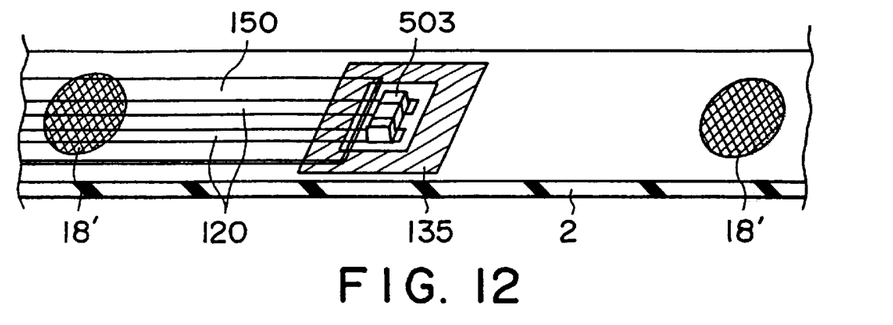
FIG. 12 is an enlarged view of a portion of yet another alternative embodiment of the present invention.
Figure 13:
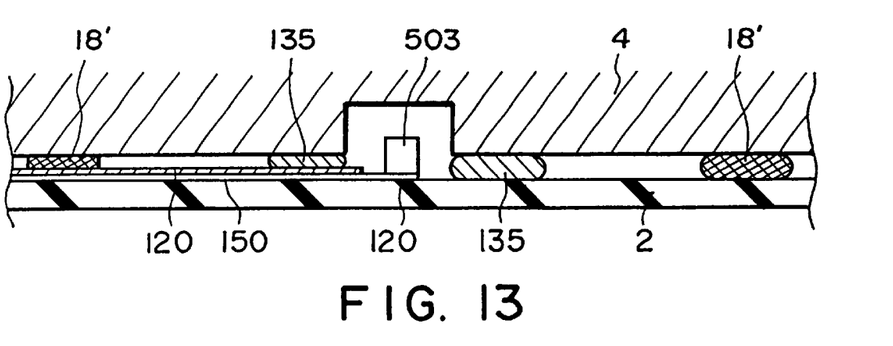
FIG. 13 is a sectional view of a portion of the heater, depicting how the heater shown in FIG. 12 is glued on the holder.

Another alternative embodiment is shown in FIGS. 12 and 13.

In this embodiment, a coating 150 of insulating material such as glass, epoxy resin, polyimide, or the like is provided on a pair of electrodes 120. The electrodes 120 are protected from moisture by this coating 150. The substrate 2 of the heater and the holder 4 are glued with an adhesive 135 placed in a manner to seal hermetically the space in which the thermistor 503 is positioned, and also, the substrate 2 is glued to the holder 4 with an adhesive 18'.

Generally speaking, it is difficult to adhere perfectly the entire back surface of the heater to the holder 4; therefore, gaps are created somewhere. In this case, it is also impossible to detect where the gaps are. In FIGS. 12 and 13, the electrodes 120 are coated in advance, wherein lack of coating 150 is easy to detect visually, assuring perfect moistureproofing. Therefore, all that is needed to moistureproof the circuit system of the thermistor is to glue the substrate 2 and the holder 4 with the adhesive 135.

Figure 14:
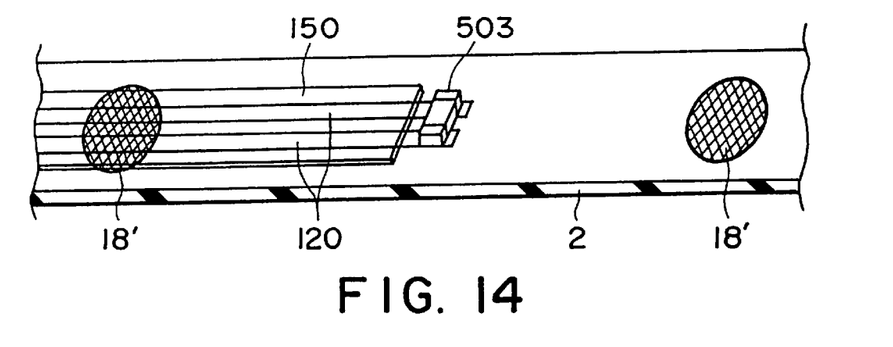
FIG. 14 is an enlarged view of a portion of yet another alternative embodiment of the present invention.
Figure 15:
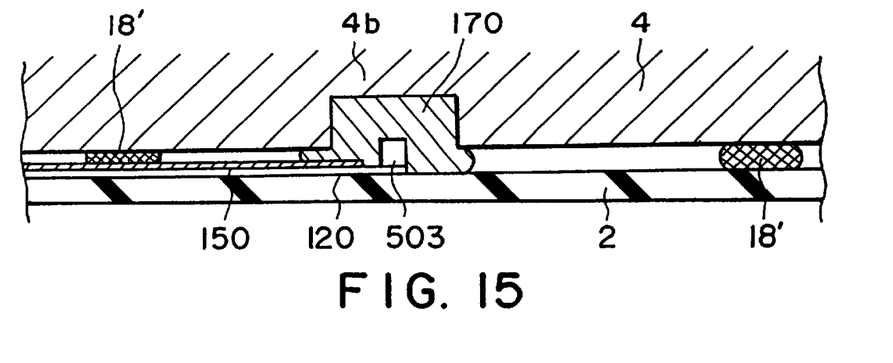
FIG. 15 is a sectional view of the portion of heater, depicting how the heater shown in FIG. 14 is glued on the holder.

FIGS. 14 and 15 shows yet another embodiment of the present invention.

In this embodiment, an elastic material 170 such as silicone rubber is filled, surrounding a thermistor 503, so that the thermistor 503 is hermetically sealed. The electrodes 120 are moistureproofed by a coating 150. Thus, the migration is prevented in the same manner as the preceding embodiments.

While the invention has been described with reference to the structures disclosed therein, it is not confined to the details set forth and this application is intended to cover such modifications or changes as may come within the purposes of the improvements of the scope of the following claims.

What is claimed is:

1. A heater comprising:
    a substrate;
    a resistance layer on said substrate, for generating heat when supplied with electric energy;
    a temperature sensor chip for sensing a temperature;
    a pair of electrodes provided on said substrate for supplying electric energy to said temperature sensor chip, wherein said temperature sensor chip is attached to said pair of electrodes through an electro conductive adhesive material; and
    an electrically insulative material filled between said electrodes.

2. A heater according to claim 1, wherein said heater is used in a fixing apparatus for fixing an unfixed image and serves as a fixing heater for heating the unfixed image.

3. A heater according to claim 2, said fixing apparatus further comprising a film which moves, sliding on said heater, with a sheet of recording material,
    wherein said heater remains stationary while in use and the unfixed image carried on the recording material is heated, through said film, by heat from said heater.

4. A heater according to claim 1, wherein said temperature sensor chip comprises a block having a temperature sensing portion and an output portion.

5. A heater according to claim 4, wherein the output portion is overlaid on said pair of electrodes.

6. A heater according to claim 4, wherein the temperature sensing portion comprises a surface electric insulation coating.

7. A heater according to claim 1, wherein said substrate has a high thermal conductivity.

8. A heater according to claim 1, wherein said temperature sensor chip is provided on a side of said substrate opposite from a side having said resistance layer.

9. A heater according to claim 1, wherein each electrode of said pair of electrodes comprises a thin layer of material selected from the group consisting of Ag, Ag/Pd, Ag/Pt, Pt, and Au.

10. A heater according to claim 1, wherein said electrically insulative material has an adhesive property.

11. A heater according to claim 1, wherein said temperature sensor chip is bonded on said pair of electrodes by an electro-conductive adhesive material.

12. A fixing heater for fixing an unfixed image to a recording material, comprising:

a substrate;

a resistance layer on said substrate, for generating heat when supplied with electric energy;

a temperature sensor chip for sensing a temperature;

a pair of electrodes provided on said substrate for supplying electric energy to said temperature sensor chip, wherein said temperature sensor chip is attached to said pair of electrodes through an electro-conductive adhesive material; and an electrically insulative material filling substantially all spaces enclosed by said pair of electrodes, said temperature sensor chip, and said substrate, wherein said electrically insulative material contacts both of said pair of electrodes.

\* \* \* \* \*

UNITED STATES PATENT AND TRADEMARK OFFICE
CERTIFICATE OF CORRECTION

PATENT NO. : 6,248,978 B1
DATED : June 19, 2001
INVENTOR(S) : Kouichi Okuda

It is certified that error appears in the above-identified patent and that said Letters Patent is hereby corrected as shown below:

Column 4,
Line 59, "504" should be deleted.

Column 10,
Line 28, "shows" should read -- show --.

Signed and Sealed this

Thirtieth Day of April, 2002

Attest:

Attesting Officer

JAMES E. ROGAN
*Director of the United States Patent and Trademark Office*